(12) United States Patent
Ishikawa et al.

(10) Patent No.: US 8,335,059 B2
(45) Date of Patent: Dec. 18, 2012

(54) TUNNELING MAGNETORESISTIVE EFFECT ELEMENT AND SPIN MOS FIELD-EFFECT

(75) Inventors: Mizue Ishikawa, Yokohama (JP);
Yoshiaki Saito, Kawasaki (JP);
Hideyuki Sugiyama, Kawasaki (JP);
Tomoaki Inokuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/533,198

(22) Filed: Jun. 26, 2012

(65) Prior Publication Data
US 2012/0273856 A1 Nov. 1, 2012

Related U.S. Application Data

(62) Division of application No. 12/342,383, filed on Dec. 23, 2008, now Pat. No. 8,243,400.

(30) Foreign Application Priority Data

Jan. 11, 2008 (JP) .................................. 2008-005041

(51) Int. Cl.
*G11B 5/39* (2006.01)
*H01L 21/02* (2006.01)
*H01L 29/82* (2006.01)

(52) U.S. Cl. ..................... 360/324.2; 257/295; 257/425
(58) Field of Classification Search ........ 360/324–324.2; 257/295, 421, 425, 427
See application file for complete search history.

(56) References Cited

U.S. PATENT DOCUMENTS

| 7,602,636 B2 * | 10/2009 | Saito et al. ..................... 365/158 |
| 7,709,867 B2 | 5/2010 | Ishikawa et al. |
| 7,936,028 B2 * | 5/2011 | Hong et al. ..................... 257/421 |
| 7,956,395 B2 | 6/2011 | Inokuchi et al. |
| 7,973,351 B2 | 7/2011 | Inokuchi et al. |
| 8,243,400 B2 * | 8/2012 | Ishikawa et al. ........... 360/324.2 |
| 2008/0061332 A1 | 3/2008 | Saito et al. |
| 2009/0097168 A1 | 4/2009 | Inomata et al. |
| 2010/0200899 A1 * | 8/2010 | Marukame et al. .......... 257/295 |

FOREIGN PATENT DOCUMENTS

| JP | 8-250366 | 9/1996 |
| JP | 2003-92412 | 3/2003 |
| JP | 2006-32915 | 2/2006 |
| JP | 2006-73861 | 3/2006 |
| JP | 2006-228968 A | 8/2006 |

(Continued)

OTHER PUBLICATIONS

N. Tezuka et al, "Tunnel magnetoresistance for junctions with epitaxial full-Heusler Co2FeAl0.5Si0.5 electrodes with B2 and L21 structures", Applied Physics Letters 89, 2006, 3 pages.

*Primary Examiner* — Will J Klimowicz
(74) *Attorney, Agent, or Firm* — Oblon, Spivak, McClelland, Maier & Neustadt, L.L.P.

(57) ABSTRACT

A magnetoresistive effect element includes a first ferromagnetic layer, Cr layer, Heusler alloy layer, barrier layer, and second ferromagnetic layer. The first ferromagnetic layer has the body-centered cubic lattice structure. The Cr layer is formed on the first ferromagnetic layer and has the body-centered cubic lattice structure. The Heusler alloy layer is formed on the Cr layer. The barrier layer is formed on the Heusler alloy layer. The second ferromagnetic layer is formed on the barrier layer.

4 Claims, 6 Drawing Sheets

FOREIGN PATENT DOCUMENTS

| | | |
|---|---|---|
| JP | 2006-295001 | 10/2006 |
| JP | 2007-92147 A | 4/2007 |
| JP | 2007-150265 A | 6/2007 |
| JP | 2009054724 A * | 3/2009 |
| JP | 2009059820 A * | 3/2009 |
| JP | 2009239122 A * | 10/2009 |
| WO | WO 2005/088745 A1 | 9/2005 |
| WO | WO 2007/126071 A1 | 11/2007 |

* cited by examiner

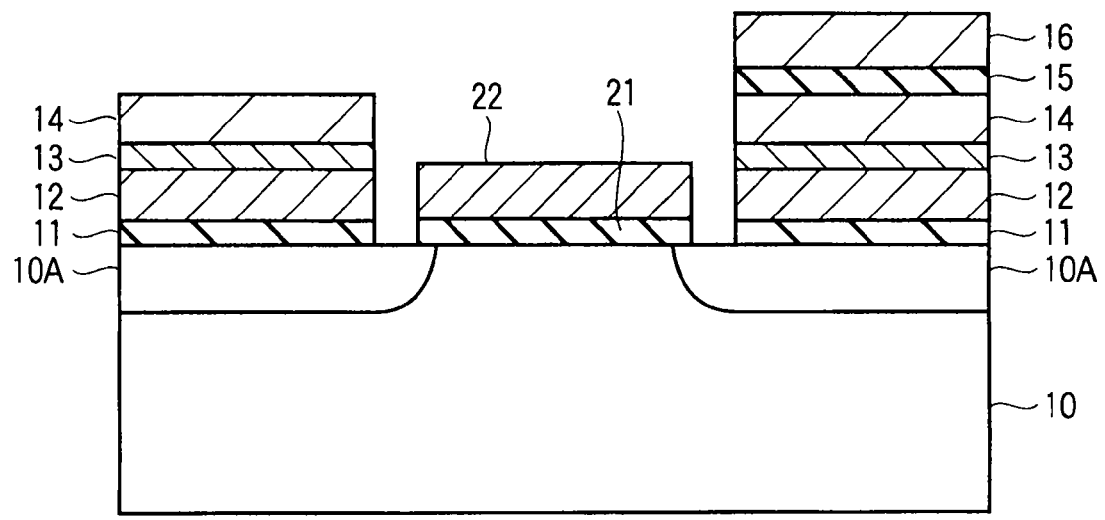
F I G. 3
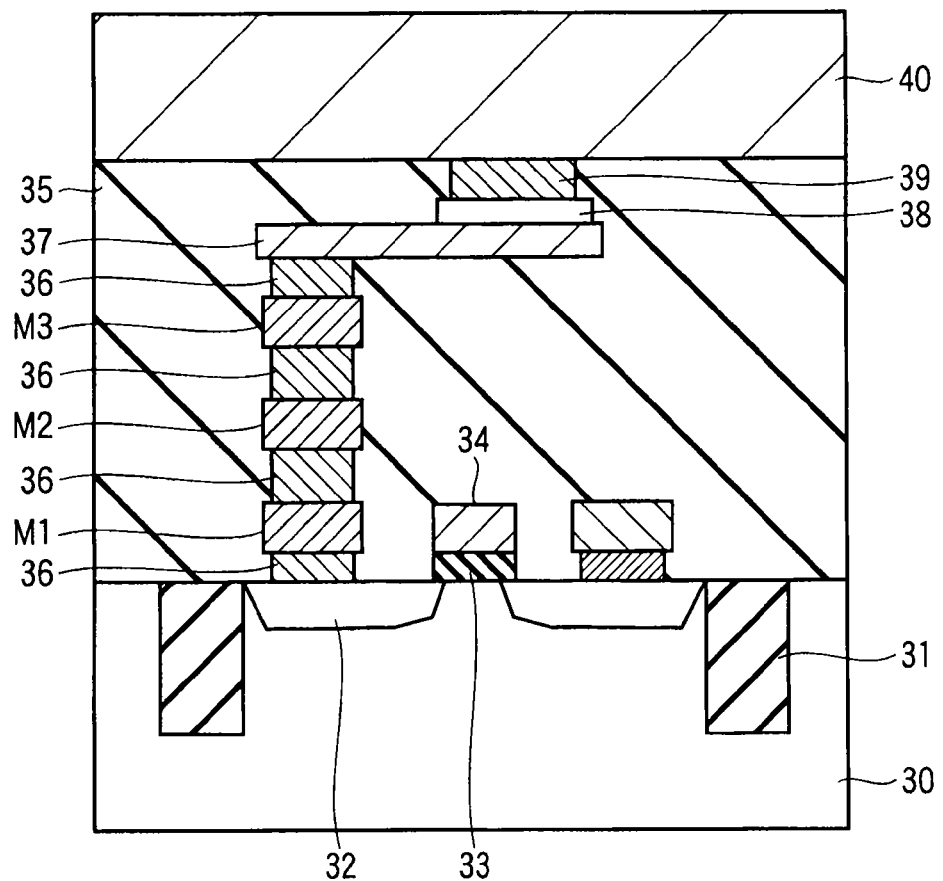
F I G. 4

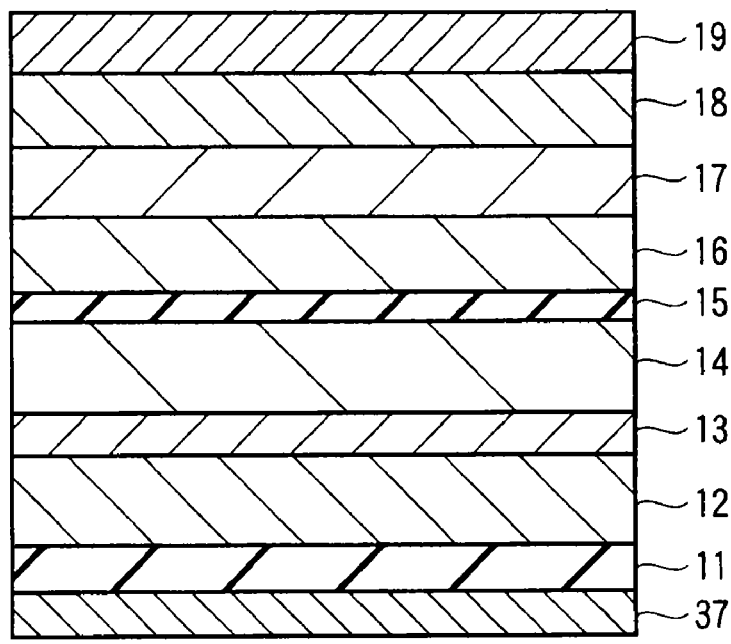
F I G. 5
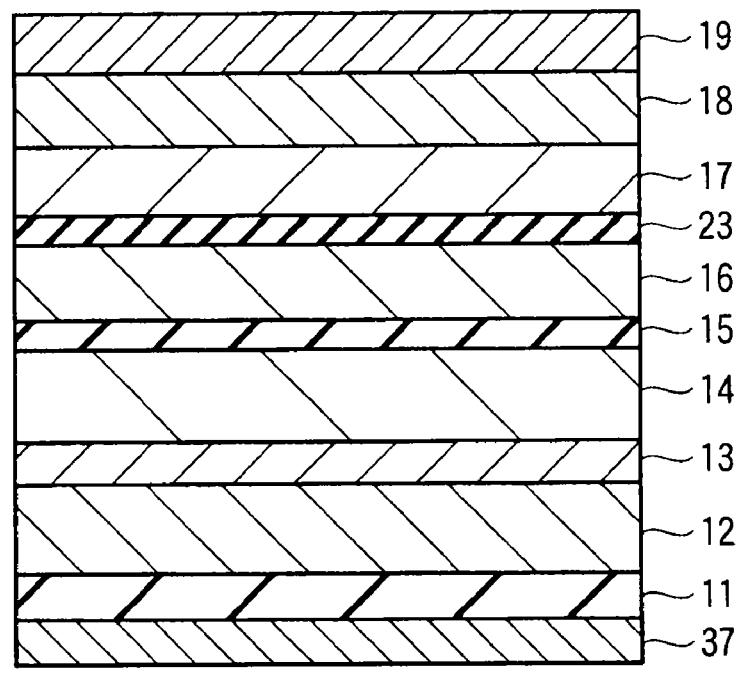
F I G. 6

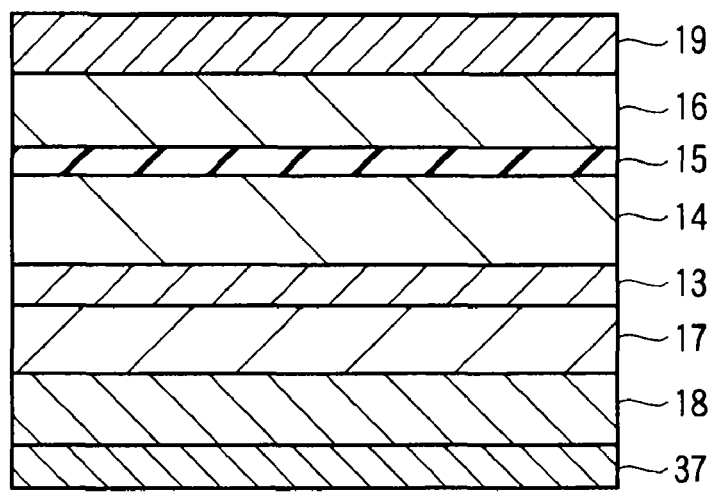
F I G. 7
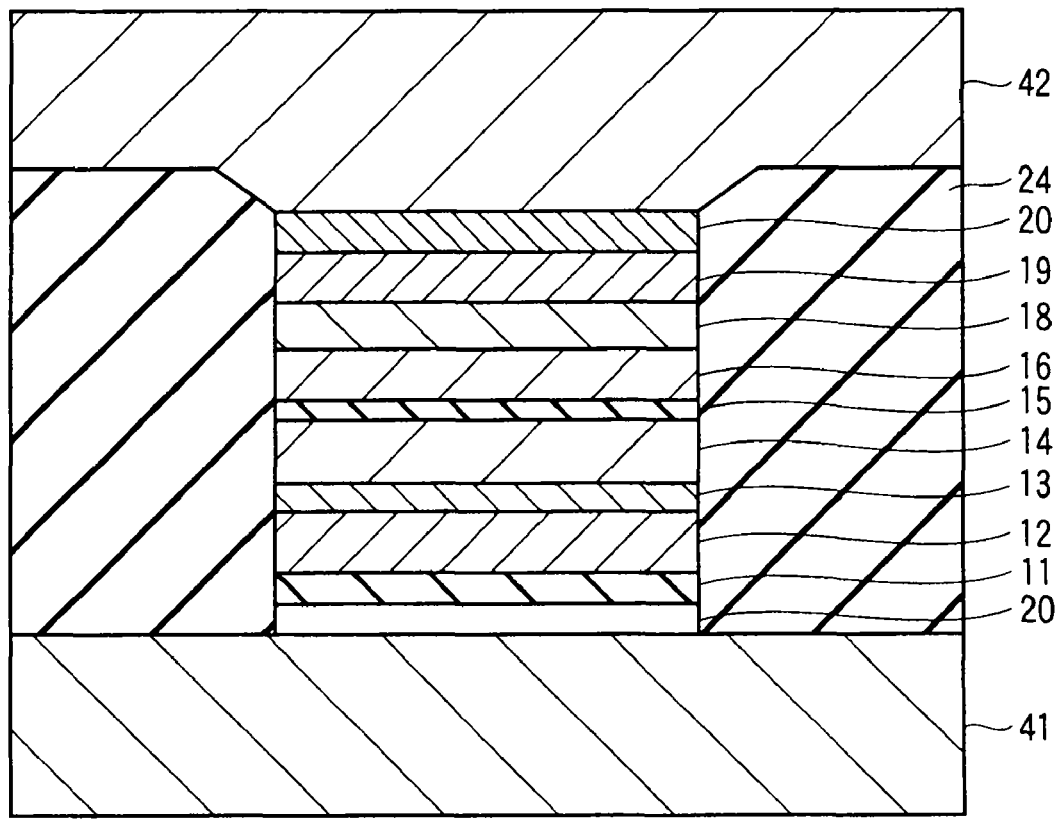
F I G. 8

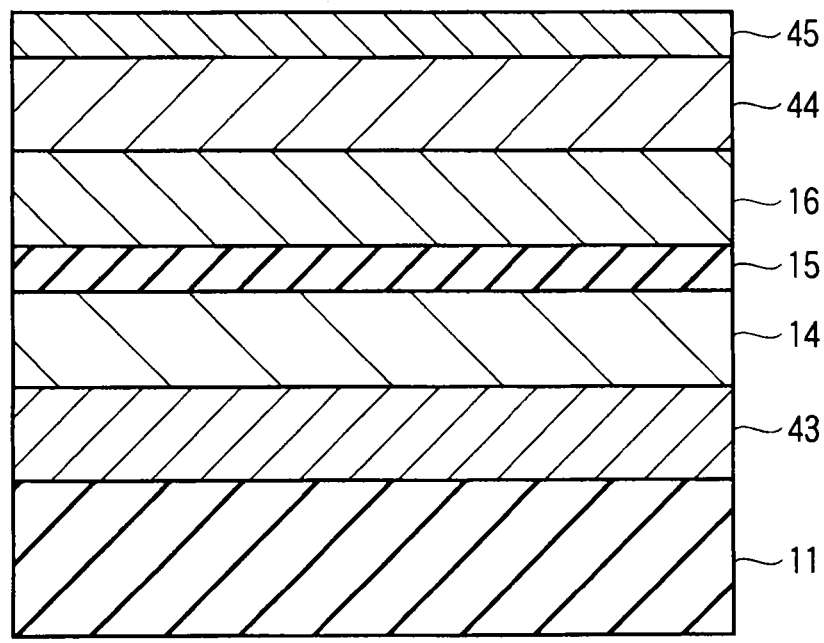
F I G. 9
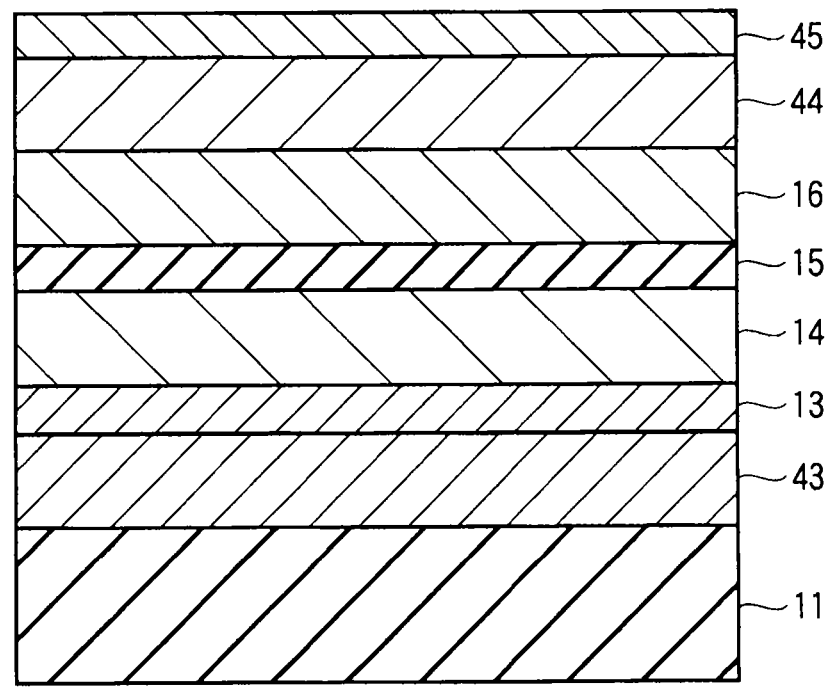
F I G. 10

1

TUNNELING MAGNETORESISTIVE EFFECT ELEMENT AND SPIN MOS FIELD-EFFECT

CROSS-REFERENCE TO RELATED APPLICATIONS

This application is a division of and claims the benefit of priority under 35 U.S.C. §120 from U.S. Ser. No. 12/342,383, filed Dec. 23, 2008 now U.S. Pat. No. 8,243,400 and claims the benefit of priority from prior Japanese Patent Application No. 2008-005041, filed Jan. 11, 2008, the entire contents of which are incorporated herein by reference.

BACKGROUND OF THE INVENTION

1. Field of the Invention

The present invention relates to the tunneling magnetoresistive effect element and spin MOS field-effect transistor using a Heusler alloy.

2. Description of the Related Art

Recently, a magnetic memory (magnetic random access memory [MRAM]) using the tunneling magnetoresistive effect (TMR) element (or a magnetic tunnel junction [MTJ] element) having a sandwiched structure including a ferromagnetic material/insulator/ferromagnetic material as a memory element has been proposed. This device is used as a memory by fixing (or maintaining) spins in one ferromagnetic material layer (a fixed layer or reference layer), and controlling (or changing) spins in the other ferromagnetic material layer (a free layer or recording layer), thereby changing the resistance between the two layers in the sandwiched structure. The resistance decreases when the spins in the fixed layer and free layer are parallel, and increases when they are antiparallel. The magnetoresistive change ratio (TMR ratio) as an index of this spin efficiency is a few 10% at room temperature a few years ago, but has reached 500% in recent years. This widens the range of possibility of the device not only as an MRAM but also as various spin devices. As an example, a spin MOS field-effect transistor (spin MOSFET) combined with an MTJ element has been proposed. This makes a double resistance change by the gate electrode and TMR ratio feasible by combining the MTJ element with the spin MOSFET obtained by adding the degree of freedom of spins to carriers.

It is important to increase the TMR ratio in order to realize a high-efficiency magnetic memory or spin MOSFET. To this end, it is necessary to use a ferromagnetic material having a high spin polarization ratio (P). When a semi-metallic material in which P=100% is used, the TMR ratio is theoretically infinite from Julliere's law. Candidates of a room-temperature, semi-metallic material are $CrO_2$, $Fe_3O_4$, and a Heusler alloy. Recently, Co-based Heusler alloys have achieved high TMR ratios, so spin devices using these alloys are expected. A Heusler alloy (also called a full-Heusler alloy) is a general term for intermetallic compounds having a chemical composition represented by $X_2YZ$ where X is a Co-, Ni-, or Cu-based transition metal element or noble metal element in the periodic table, Y is an Mn-, V-, or Ti-based transition metal, and Z is a main group element of groups III to V. The Heusler alloy $X_2YZ$ can be classified into three types of crystal structures in accordance with the regularities of X, Y and Z. The $L2_1$ structure is a structure having the highest regularity, in which $X \neq Y \neq Z$, i.e., the three elements can be distinguished from each other. The B2 structure is a structure having the second highest regularity, in which $X \neq Y=Z$. The A2 structure is a structure in which X=Y=Z, i.e., the three elements cannot be distinguished from each other.

To achieve a high TMR ratio by using the Heusler alloy, epitaxial growth of a regular crystal structure is indispensable when forming a stacked structure. The past research reveals that an epitaxially grown B2 structure or $L2_1$ structure is necessary to achieve a high spin polarization ratio of the Heusler alloy. Especially when using the Heusler alloy in a spin MOSFET, a technique of forming a highly regular Heusler alloy on a semiconductor is indispensable (e.g., N. Tezuka, et. al., Appl. Phys. Lett. 89(2006)112514).

BRIEF SUMMARY OF THE INVENTION

According to a first aspect of the present invention, there is provided a magnetoresistive effect element comprising: a first ferromagnetic layer having a body-centered cubic lattice structure; a Cr layer formed on the first ferromagnetic layer and having the body-centered cubic lattice structure; a Heusler alloy layer formed on the Cr layer; a barrier layer formed on the Heusler alloy layer; and a second ferromagnetic layer formed on the barrier layer.

According to a second aspect of the present invention, there is provided a spin MOS field-effect transistor comprising, in a source and a drain, a structure including: an MgO layer formed on a semiconductor substrate; a first ferromagnetic layer formed on the MgO layer and having a body-centered cubic lattice structure; a Cr layer formed on the first ferromagnetic layer and having the body-centered cubic lattice structure; and a Heusler alloy layer formed on the Cr layer.

According to a third aspect of the present invention, there is provided a spin MOS field-effect transistor comprising, in at least one of a source and a drain, a structure including: an MgO layer formed on a semiconductor substrate; a first ferromagnetic layer formed on the MgO layer and having a body-centered cubic lattice structure; a Cr layer formed on the first ferromagnetic layer and having the body-centered cubic lattice structure; a Heusler alloy layer formed on the Cr layer; a barrier layer formed on the Heusler alloy layer; and a second ferromagnetic layer formed on the barrier layer.

BRIEF DESCRIPTION OF THE SEVERAL VIEWS OF THE DRAWING

FIG. 3 is a sectional view of a spin MOSFET of the third embodiment;

FIG. 4 is a sectional view of a memory cell in an MRAM of the fourth embodiment;

FIG. 5 is a sectional view of an MTJ element in the memory cell of the fourth embodiment;

FIG. 6 is a sectional view of another MTJ element in the memory cell of the fourth embodiment;

FIG. 7 is a sectional view of still another MTJ element in the memory cell of the fourth embodiment;

FIG. 8 is a sectional view of a TMR head of the fifth embodiment;

FIG. 9 is a sectional view of a tunneling magnetoresistive effect element as a comparative example;

FIG. 10 is a sectional view of a tunneling magnetoresistive effect element as an example.

DETAILED DESCRIPTION OF THE INVENTION

Figure 1:
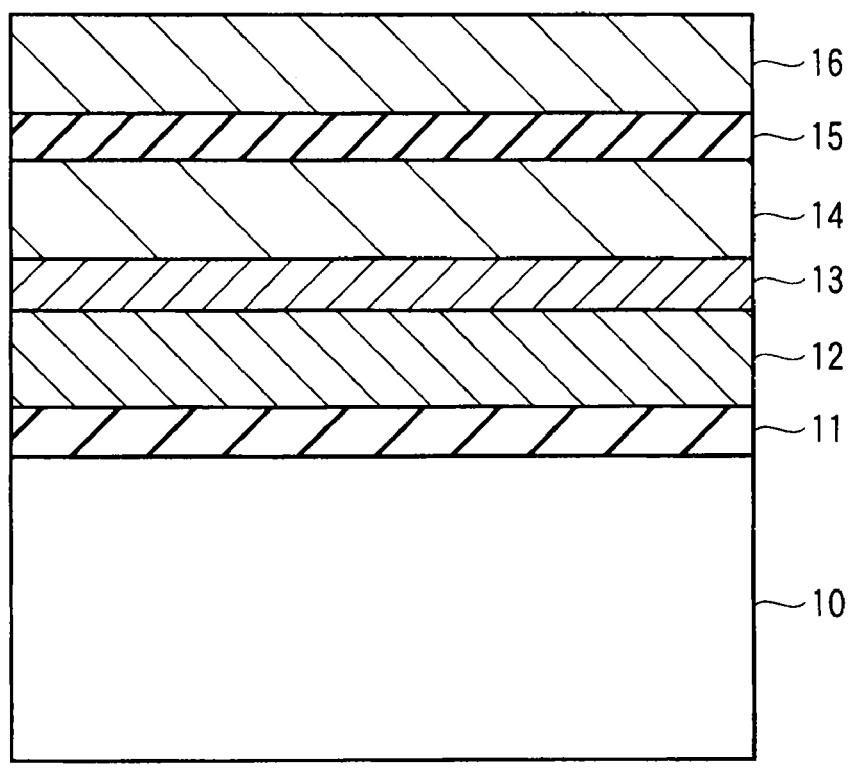
FIG. 1 is a sectional view of a tunneling magnetoresistive effect element of the first embodiment.

Embodiments of the present invention will be explained below with reference to the accompanying drawing. In the following explanation, the same reference numerals denote the same parts throughout the drawings.

First Embodiment

First, a tunneling magnetoresistive effect element of the first embodiment of the present invention will be explained below. FIG. 1 is a sectional view showing the structure of the tunneling magnetoresistive effect element of the first embodiment.

As shown in FIG. 1, the tunneling magnetoresistive effect element of the first embodiment has a structure in which an MgO layer 11, a ferromagnetic layer 12 having the body-centered cubic (bcc) structure, and a Cr layer 13 having the bcc structure are sequentially formed on a semiconductor single-crystal substrate 10, and a tunneling magnetoresistive effect element using a Heusler alloy is formed on the Cr layer 13.

More specifically, the MgO layer 11 is formed on the surface of the semiconductor substrate 10, and the ferromagnetic layer 12 having the bcc structure is formed on the MgO layer 11. In addition, the Cr layer 13 having the bcc structure is formed on the ferromagnetic layer 12, and a Heusler alloy layer 14 is formed on the Cr layer 13. Furthermore, a tunnel barrier layer (e.g., an MgO layer) 15 is formed on the Heusler alloy layer 14, and a Heusler alloy layer 16 is formed on the tunnel barrier layer 15. One of the Heusler alloy layers 14 and 16 is regarded as a free layer (magnetization free layer or recording layer), a magnetization thereof is made invertible (or variable), and the other is regarded as a pinned layer (magnetization fixed layer or reference layer), and a magnetization thereof is fixed (or invariable). The resistance of the tunneling magnetoresistive effect element can be changed by changing the relative relationship between the magnetization in the free layer and that in the pinned layer by, e.g., a spin injection method or current-induced magnetic field application method. Note that the MgO layer 11 is desirably (001)-oriented. Note also that the Heusler alloy layer 16 may also be a ferromagnetic layer, e.g., Fe—Co or Fe—Co—B.

In the tunneling magnetoresistive effect element having the above structure, an epitaxially grown Heusler alloy having a highly regular crystal structure (the B2 structure or $L2_1$ structure) can be formed on the semiconductor substrate. In addition, the roughness of the interface between the tunnel barrier layer and Heusler alloy layer in the MTJ element can be reduced by forming the Cr layer having the bcc structure between the ferromagnetic layer and Heusler alloy layer. Accordingly, it is possible to form a tunneling magnetoresistive effect element using the Heusler alloy and having a high TMR ratio. Also, carriers to which the degree of freedom of spins is added can be conducted in the semiconductor substrate because the ferromagnetic layer having the bcc structure is formed.

The film thickness of the Cr layer having the bcc structure is preferably 3 nm or less. When the film thickness of the Cr layer is 3 nm or less, the lattice constant of the ferromagnetic layer having the bcc structure can be taken over. This makes it possible to control the lattice constant of the Heusler alloy formed on the Cr layer by the ferromagnetic layer having the bcc structure and the Cr layer having the bcc structure as the underlying layers.

Second Embodiment

Figure 2:
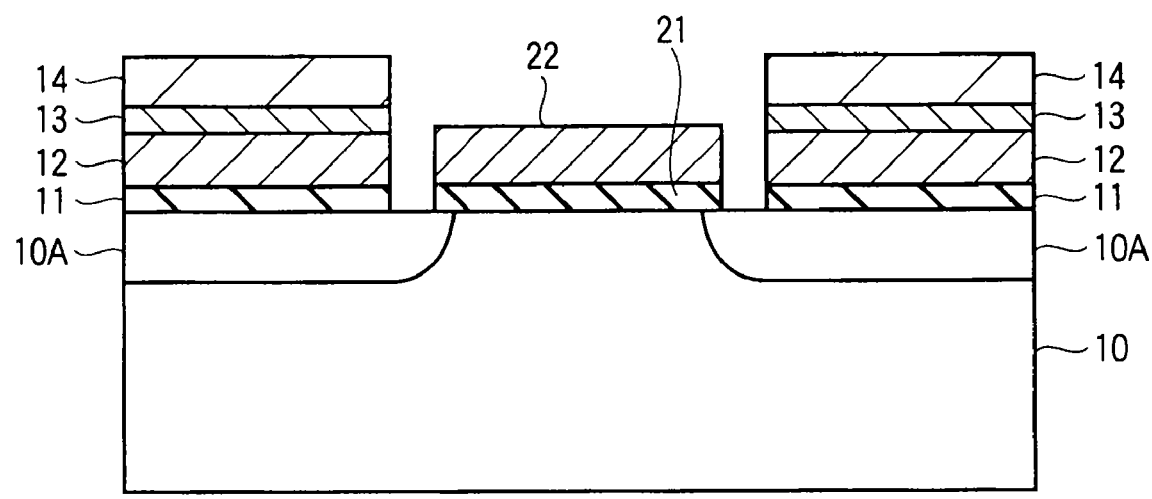
FIG. 2 is a sectional view of a spin MOSFET of the second embodiment.

A spin MOSFET of the second embodiment of the present invention will be explained below. FIG. 2 is a sectional view showing the structure of the spin MOSFET of the second embodiment.

As shown in FIG. 2, impurity diffusion layers 10A as a source and drain are formed in the surface region of a semiconductor substrate 10 by ion implantation. MgO layers 11 are formed on the impurity diffusion layers 10A. Ferromagnetic layers 12 having the bcc structure are formed on the MgO layers 11. Cr layers 13 having the bcc structure are formed on the ferromagnetic layers 12, and epitaxially grown Heusler alloy layers 14 are formed on the Cr layers 13. Antiferromagnetic coupling may also be formed between the ferromagnetic layers 12 and Heusler alloy layers 14 via the Cr layers 13. Furthermore, a gate insulating film 21 is formed on the semiconductor substrate 10 between the source and drain, and a gate electrode 22 is formed on the gate insulating film 21. Note that the MgO layers 11 are desirably (001)-oriented.

In the spin MOSFET of this embodiment, one of the Heusler alloy layers 14 on the source and drain is regarded as a free layer (magnetization free layer or recording layer), a magnetization thereof is made invertible (or variable), and the other is regarded as a pinned layer (magnetization fixed layer or reference layer), and a magnetization thereof is fixed (or invariable). It is only necessary to use a magnetic material having a high holding force as the pinned layer, or form an antiferromagnetic layer on the pinned layer. The resistance of the tunneling magnetoresistive effect element can be changed by changing the relative relationship between the magnetization in the free layer and that in the pinned layer. The magnetization in the free layer can be changed by means of, e.g., a method of injecting spins via a channel or the like, or a current-induced magnetic field application method.

A method of manufacturing the spin MOSFET shown in FIG. 2 will be explained below. First, a channel region is formed in a semiconductor substrate 10 by ion implantation and annealing. After that, a silicon oxide film 21 and polysilicon film 22, for example, are sequentially formed on the semiconductor substrate 10. Then, as shown in FIG. 2, a gate insulating film 21 and gate electrode 22 are formed by etching away the silicon oxide film 21 and polysilicon film 22 from prospective source and drain portions.

Impurity diffusion layers 10A are formed by ion implantation and annealing in the prospective source and drain portions of the surface region of the semiconductor substrate 10. Subsequently, an MgO layer 11 is formed on the impurity diffusion layers 10A by sputtering. A ferromagnetic layer 12 having the bcc structure is formed on the MgO layer 11 by sputtering. A Cr layer 13 having the bcc structure is formed on the ferromagnetic layer 12 by sputtering. In addition, an epitaxially grown Heusler alloy layer 14 is formed on the Cr layer 13. Then, source and drain electrodes are formed by patterning the MgO layer 11, ferromagnetic layer 12, Cr layer 13, and Heusler alloy layer 14 by means of, e.g., liftoff, ion milling, or RIE. In this manner, the spin MOSFET shown in FIG. 2 is manufactured.

Next, the conditions of ion implantation for forming the impurity diffusion layers 10A in the spin MOSFET will be explained below. As an ion candidate to be substituted, it is possible to use, e.g., phosphorus (P), arsenic (As), or boron (B). The projection range is desirably 20 nm or less, and the acceleration voltage is preferably 20 keV or less. The carrier concentration in the impurity diffusion layer 10A is $10^{18}$ to $10^{20}/cm^3$. The annealing conditions will now be explained. As the annealing method, normal annealing or rapid thermal annealing (RTA) can be used. Annealing of the impurity diffusion layers can be performed after the MgO layer 11 is formed, or after the Heusler alloy layer 14 is formed. Annealing is desirably performed after the formation of the MgO layer 11 and before the subsequent film formation. When annealing is performed after the MgO layer 11 is formed, the crystallinity of the MgO layer 11 can be improved.

In the spin MOSFET having the above structure, an epitaxially grown Heusler alloy having a highly regular crystal structure (the B2 structure or $L2_1$ structure) can be formed on the semiconductor substrate. In addition, the roughness of the interface between the tunnel barrier layer and Heusler alloy layer in the MTJ element can be reduced by forming the Cr layer having the bcc structure between the ferromagnetic layer and Heusler alloy layer. Also, carriers to which the degree of freedom of spins is added can be conducted in the semiconductor substrate because the ferromagnetic layer 12 having the bcc structure is formed. That is, carriers having spins to be supplied to the source or drain are conducted as they tunnel through the MgO layer 11 as a barrier layer via the ferromagnetic layer 12 having the bcc structure.

The film thickness of the Cr layer having the bcc structure is preferably 3 nm or less. When the film thickness of the Cr layer is 3 nm or less, the lattice constant of the ferromagnetic layer having the bcc structure can be taken over. This makes it possible to control the lattice constant of the Heusler alloy formed on the Cr layer by the ferromagnetic layer having the bcc structure and the Cr layer having the bcc structure as the underlying layers.

Third Embodiment

A spin MOSFET of the third embodiment of the present invention will be explained below. FIG. 3 is a sectional view showing the structure of the spin MOSFET of the third embodiment.

As shown in FIG. 3, impurity diffusion layers 10A as a source and drain are formed in the surface region of a semiconductor substrate 10 by ion implantation and annealing. MgO layers 11 are formed on the impurity diffusion layers 10A. Ferromagnetic layers 12 having the bcc structure are formed on the MgO layers 11. Cr layers 13 having the bcc structure are formed on the ferromagnetic layers 12, and epitaxially grown Heusler alloy layers 14 are formed on the Cr layers 13. Antiferromagnetic coupling may also be formed between the ferromagnetic layers 12 and Heusler alloy layers 14 via the Cr layers 13. Also, a tunnel barrier layer 15 is formed in at least one of the source and drain, and a Heusler alloy layer 16 is formed on the tunnel barrier layer 15. In other words, in at least one of the source and drain, a TMR element (a stacked structure including the Heusler alloy layer 14, tunnel barrier layer 15, and Heusler alloy layer 16) using the Heusler alloy is formed on the Cr layer 13 and ferromagnetic layer 12 on the MgO layer 11. In addition, a gate insulating film 21 is formed on the semiconductor substrate 10 between the source and drain, and a gate electrode 22 is formed on the gate insulating film 21. Note that the MgO layers 11 are desirably (001)-oriented. Note also that the Heusler alloy layer 16 may also be a ferromagnetic layer, e.g., Fe—Co or Fe—Co—B.

In the spin MOSFET of this embodiment, one of the Heusler alloy layers 14 on the source and drain is regarded as a free layer (magnetization free layer or recording layer), a magnetization thereof is made invertible (or variable), and the other is regarded as a pinned layer (magnetization fixed layer or reference layer), and a magnetization thereof is fixed (or invariable). Furthermore, the Heusler alloy layer 16 also functions as a pinned layer, and the magnetization direction in the Heusler alloy layer 16 may be the same as or opposite to that in the Heusler alloy layer (pinned layer) 14. It is only necessary to use a magnetic material having a high holding force as these pinned layers, or form an antiferromagnetic layer on each pinned layer. The resistance of the tunneling magnetoresistive effect element can be changed by changing the relative relationship between the magnetization in the free layer and that in the pinned layer. The magnetization in the free layer can be changed by means of, e.g., a method of injecting spins via a channel or the like, or a current-induced magnetic field application method.

A method of manufacturing the spin MOSFET shown in FIG. 3 will be explained below. First, a channel region is formed in a semiconductor substrate 10 by ion implantation and annealing. After that, a silicon oxide film 21 and polysilicon film 22, for example, are sequentially formed on the semiconductor substrate 10. Then, as shown in FIG. 3, a gate insulating film 21 and gate electrode 22 are formed by etching away the silicon oxide film 21 and polysilicon film 22 from prospective source and drain portions.

Impurity diffusion layers 10A are formed by ion implantation and annealing in the prospective source and drain portions of the surface region of the semiconductor substrate 10. Subsequently, an MgO layer 11 is formed on the impurity diffusion layers 10A by sputtering. A ferromagnetic layer 12 having the bcc structure is formed on the MgO layer 11 by sputtering. A Cr layer 13 having the bcc structure is formed on the ferromagnetic layer 12 by sputtering. In addition, an epitaxially grown Heusler alloy layer 14 is formed on the Cr layer 13. Then, source and drain electrodes are formed by patterning the MgO layer 11, ferromagnetic layer 12, Cr layer 13, and Heusler alloy layer 14 by means of, e.g., liftoff, ion milling, or RIE.

After that, a resist film that exposes only one of the source and drain electrodes and covers the rest is formed. Subsequently, a tunnel barrier layer 15 and Heusler alloy layer 16 are stacked on the semiconductor substrate 10, and the resist film is removed, thereby forming the tunnel barrier layer 15 and Heusler alloy layer 16 on only one of the source and drain electrodes. As a consequence, an MTJ element is formed on at least one of the source and drain electrodes. In this way, the spin MOSFET shown in FIG. 3 is manufactured.

In the first, second, and third embodiments explained above, as the ferromagnetic layer 12 having the bcc structure, it is possible to use iron (Fe), iron cobalt (Fe—Co), iron manganese (Fe—Mn), an alloy containing at least one of vanadium (V), niobium (Nb), molybdenum (Mo), tantalum (Ta), nickel (Ni), and tungsten (W) in addition to Fe, Fe—Co, or Fe—Mn, or a stacked structure of these ferromagnetic materials. It is also possible to adjust the lattice constant of the Heusler alloy by that of the ferromagnetic layer 12 having the bcc structure by decreasing the film thickness of the Cr layer 13 having the bcc structure.

In addition, the first, second, and third embodiments explained above are characterized in that the semiconductor substrate is a substrate having one of an Si single crystal, Ge single crystal, GaAs single crystal, and Si—Ge single crystal on at least the surface, or a silicon-on-insulator (SOI) substrate.

In the spin MOSFET having the above structure, an epitaxially grown Heusler alloy having a highly regular crystal structure (the B2 structure or $L2_1$ structure) can be formed on the semiconductor substrate. In addition, the roughness of the interface between the tunnel barrier layer and Heusler alloy layer in the MTJ element can be reduced by forming the Cr layer having the bcc structure between the ferromagnetic layer and Heusler alloy layer. Accordingly, it is possible to form a tunneling magnetoresistive effect element using the Heusler alloy and having a high TMR ratio. Also, carriers to which the degree of freedom of spins is added can be conducted in the semiconductor substrate because the ferromagnetic layer having the bcc structure is formed.

The film thickness of the Cr layer having the bcc structure is preferably 3 nm or less. When the film thickness of the Cr layer is 3 nm or less, the lattice constant of the ferromagnetic layer having the bcc structure can be taken over. This makes it possible to control the lattice constant of the formed Heusler alloy by the ferromagnetic layer having the bcc structure and the Cr layer having the bcc structure as the underlying layers.

Fourth Embodiment

An MRAM of the fourth embodiment of the present invention will be explained below. An MTJ element having a Heusler alloy is used in a memory cell of this MRAM. FIG. 4 is a sectional view showing the structure of the memory cell of the MRAM of the fourth embodiment.

As shown in FIG. 4, the memory cell of the MRAM of the fourth embodiment has a structure in which an electrode layer, polycrystalline metal underlying interconnection 37, MTJ element 38, and metal via (or metal hard mask) 39 are sequentially formed on a transistor formed on a semiconductor substrate 30, and a bit line 40 is formed on top of the structure.

The structure of the memory cell of the MRAM will be described in detail below. Element isolation regions 31 are formed in the semiconductor substrate 30, and source and drain regions 32 are formed in the semiconductor substrate sandwiched between the element isolation regions 31. A gate insulating film 33 is formed on the semiconductor substrate 30 between the source and drain regions. A gate electrode 34 is formed on the gate insulating film 33. An interlayer dielectric film 35 is formed on the semiconductor substrate 30. In the interlayer dielectric film 35 on the source or drain region 32, first, second, and third interconnections M1, M2, and M3 are sequentially formed with contact plugs 36 inserted between them. The polycrystalline metal underlying interconnection 37 is formed on the contact plug 36 on the third interconnection M3. The MTJ element 38 is formed on the polycrystalline metal underlying interconnection 37. The metal via (or metal hard mask) 39 is formed on the MTJ element 38. The bit line 40 is formed on the metal via 39.

FIG. 5 shows details of the sectional structure of the MTJ element 38. As shown in FIG. 5, an MgO layer 11 is formed on the polycrystalline metal underlying interconnection 37. A ferromagnetic layer 12 having the bcc structure and a Cr layer 13 having the bcc structure are sequentially formed on the MgO layer 11. A Heusler alloy layer 14 (a recording layer), tunnel barrier layer (e.g., an MgO layer) 15, and Heusler alloy layer 16 are sequentially formed on the Cr layer 13. In addition, a ferromagnetic layer (e.g., a CoFe layer) 17, antiferromagnetic layer 18, and cap layer 19 are sequentially formed on the Heusler alloy layer 16 in order to form a top fixed layer. Note that the MgO layer 11 is desirably (001)-oriented.

The MTJ element 38 may also have a dual fixed layer structure as shown in FIG. 6. An MgO layer 11, a ferromagnetic layer 12 having the bcc structure, a Cr layer 13 having the bcc structure, a Heusler alloy layer 14, a tunnel barrier layer 15, and a Heusler alloy layer 16 (a recording layer) are sequentially formed on the polycrystalline metal underlying interconnection 37. In addition, a tunnel barrier layer (e.g., an MgO layer) 23, ferromagnetic layer 17, antiferromagnetic layer 18, and cap layer 19 are sequentially formed on the Heusler alloy layer 16. To allow the ferromagnetic layer 12 and Heusler alloy layer 14 to function as pinned layers, ferromagnetic layers having a high holding force need only be used as these layers. Antiferromagnetic coupling may also be formed between the ferromagnetic layer 12 and Heusler alloy layer 14 via the Cr layer 13. It is also possible to form an antiferromagnetic layer between the MgO layer 11 and ferromagnetic layer 12, and use an antiferromagnetic layer instead of the MgO layer 11.

Furthermore, although FIG. 5 shows the case where the MTJ element 38 is formed as a top fixed layer, the MTJ element 38 may also be formed as a bottom fixed layer as shown in FIG. 7. That is, it is also possible to form an MTJ structure in which an antiferromagnetic layer 18, a ferromagnetic layer 17 having the bcc structure, a Cr layer 13 having the bcc structure, an epitaxially grown Heusler alloy layer 14, a tunnel barrier layer 15, a Heusler alloy layer 16 (a recording layer), and a cap layer 19 are sequentially stacked on the polycrystalline metal underlying interconnection 37. Antiferromagnetic coupling may also be formed between the ferromagnetic layer 17 and Heusler alloy layer 14 via the Cr layer 13. It is also possible to form an MgO layer between the polycrystalline metal underlying interconnection 37 and antiferromagnetic layer 18. A material such as Al, Au, Ag, Pt, Cu, or Cr can be used as the polycrystalline metal underlying interconnection 37, and a semiconductor material such as polysilicon may also be used as the underlying interconnection. Furthermore, the Heusler alloy layer 16 shown in FIGS. 5, 6, and 7 may also be a ferromagnetic layer, e.g., Fe—Co or Fe—Co—B.

In the fourth embodiment, a tunneling magnetoresistive effect element using a Heusler alloy having a highly regular crystal structure can be formed. This makes it possible to provide an MRAM including a tunneling magnetoresistive effect element having a high TMR ratio.

Fifth Embodiment

A TMR head of the fifth embodiment of the present invention will be explained below. This TMR head is formed by using an MTJ element, and used in a hard disk drive (HDD). FIG. 8 is a sectional view showing the structure of the TMR head of the fifth embodiment.

As shown in FIG. 8, the TMR head has a structure in which the MTJ element is sandwiched between a lower electrode layer 41 and upper electrode layer 42. The MTJ element has a structure in which an amorphous layer (metal amorphous layer or insulator amorphous layer) 20, an MgO layer 11, a ferromagnetic layer 12 having the bcc structure, a Cr layer 13 having the bcc structure, an epitaxially grown Heusler alloy layer 14, a tunnel barrier layer 15, and a Heusler alloy layer 16 are sequentially stacked on the lower electrode layer 41. Antiferromagnetic coupling may also be formed between the ferromagnetic layer 12 and Heusler alloy layer 14 via the Cr layer 13.

More specifically, as shown in FIG. 8, the amorphous layer 20, the MgO layer 11, the ferromagnetic layer 12, the Cr layer 13, the Heusler alloy layer 14, the tunnel barrier layer (e.g., an MgO layer) 15, the Heusler alloy layer 16, a ferromagnetic layer (e.g., a CoFe layer) 17, an antiferromagnetic layer 18, and a cap layer 19 are sequentially formed on the lower electrode layer (magnetic shield layer) 41. In addition, the upper electrode layer (magnetic shield layer) 42 is formed on the cap layer 19. An insulating film 24 is formed between the lower electrode layer 41 and upper electrode layer 42. Note that the MgO layer 11 is desirably (001)-oriented. Note also that the Heusler alloy layer 16 may also be a ferromagnetic layer, e.g., Fe—Co or Fe—Co—B.

In the fourth and fifth embodiments explained above, as the ferromagnetic layer 12 having the bcc structure, it is possible to use iron (Fe), iron cobalt (Fe—Co), iron manganese (Fe—

Mn), an alloy containing at least one of vanadium (V), niobium (Nb), molybdenum (Mo), tantalum (Ta), nickel (Ni), and tungsten (W) in addition to Fe, Fe—Co, or Fe—Mn, or a stacked structure of these ferromagnetic materials. Also, the film thickness of the Cr layer 13 having the bcc structure is preferably 3 nm or less in order to adjust the lattice constant of the Heusler alloy by that of the ferromagnetic layer 12 having the bcc structure. The film thickness of each of the amorphous layer 20 and MgO layer 11 on the lower electrode layer 41 is desirably a film thickness that allows tunneling of carriers. When the amorphous layer 20 is a conductor, the film thickness of the MgO layer 11 is desirably 3 nm or less by which carriers can tunnel through the layer. When the amorphous layer 20 is an insulator, the total film thickness of the amorphous layer 20 and MgO layer 11 is desirably 3 nm or less.

MgO or $Al_2O_3$ can be used as the insulator layer as the tunnel barrier layer in the MTJ element. The film thickness of the tunnel barrier layer in the MTJ element is desirably a film thickness that causes no carrier spin relaxation and allows tunneling of carriers, and preferably 3 nm or less that is much smaller than the spin diffusion length.

In the fifth embodiment, a tunneling magnetoresistive effect element using a Heusler alloy having a highly regular crystal structure can be formed. This makes it possible to provide a TMR head including a tunneling magnetoresistive effect element having a high TMR ratio.

The embodiments of the present invention will be explained in more detail below by way of its comparative example and example.

As a comparative example, a tunneling magnetoresistive effect element having the Heusler alloy was manufactured. The procedure of the manufacture was as follows. FIG. 9 is a sectional view showing the structure of the tunneling magnetoresistive effect element of the comparative example.

First, the surface of a (001)-oriented MgO substrate 11 was cleaned by sputter cleaning. Then, a 20-nm-thick ferromagnetic layer (CoFe layer) 43 having the bcc structure was formed on the MgO substrate 11 by sputtering. In addition, a 30-nm-thick Heusler alloy layer 14 made of $Co_2Al_{0.5}Si_{0.5}$, a 1-nm-thick tunnel barrier layer (MgO layer) 15, and a 5-nm-thick Heusler alloy layer 16 made of $Co_2FeAl_{0.5}Si_{0.5}$ were sequentially formed on the ferromagnetic layer 43 by sputtering. Furthermore, to generate an exchange coupling magnetic field, a 10-nm-thick antiferromagnetic layer (IrMn layer) 44 was formed on the Heusler alloy layer 16, and a 7-nm-thick cap layer (Ru layer) 45 was formed on the antiferromagnetic layer 44. After the film formation, the tunneling magnetoresistive effect element of the comparative example manufactured by means of the above procedure was annealed in a vacuum at 400□.

When a current-in-plane technique (CIPT) apparatus was used to measure the magnetic reluctance of the manufactured tunneling magnetoresistive effect element, the TMR ratio was 15.6%, i.e., was very low. The TMR ratio was low even when an Fe layer was used instead of the CoFe layer 43 in the tunneling magnetoresistive effect element shown in FIG. 9.

As an example of the present invention, therefore, a tunneling magnetoresistive effect element shown in FIG. 10 was manufactured. The procedure of the manufacture was as follows. FIG. 10 is a sectional view showing the structure of the tunneling magnetoresistive effect element of the example. The tunneling magnetoresistive effect element of the example shown in FIG. 10 had a structure in which a 1-nm-thick Cr layer 13 was formed in the interface between the CoFe layer 43 having the bcc structure and the Heusler alloy layer 14 made of $Co_2FeAl_{0.5}Si_{0.5}$ in the structure shown in FIG. 9. The use of the Cr layer 13 makes it possible to reduce the roughness of the interface between the Heusler alloy layer 14 and tunnel barrier layer 15 in the MTJ element. After the film formation, the tunneling magnetoresistive effect element having this structure was annealed in a vacuum at 400□.

When a current in-plane technique (CIPT) apparatus was used to measure the magnetic reluctance of the tunneling magnetoresistive effect element of the example, the TMR ratio was 116.0%, i.e., was high.

Figure 11:
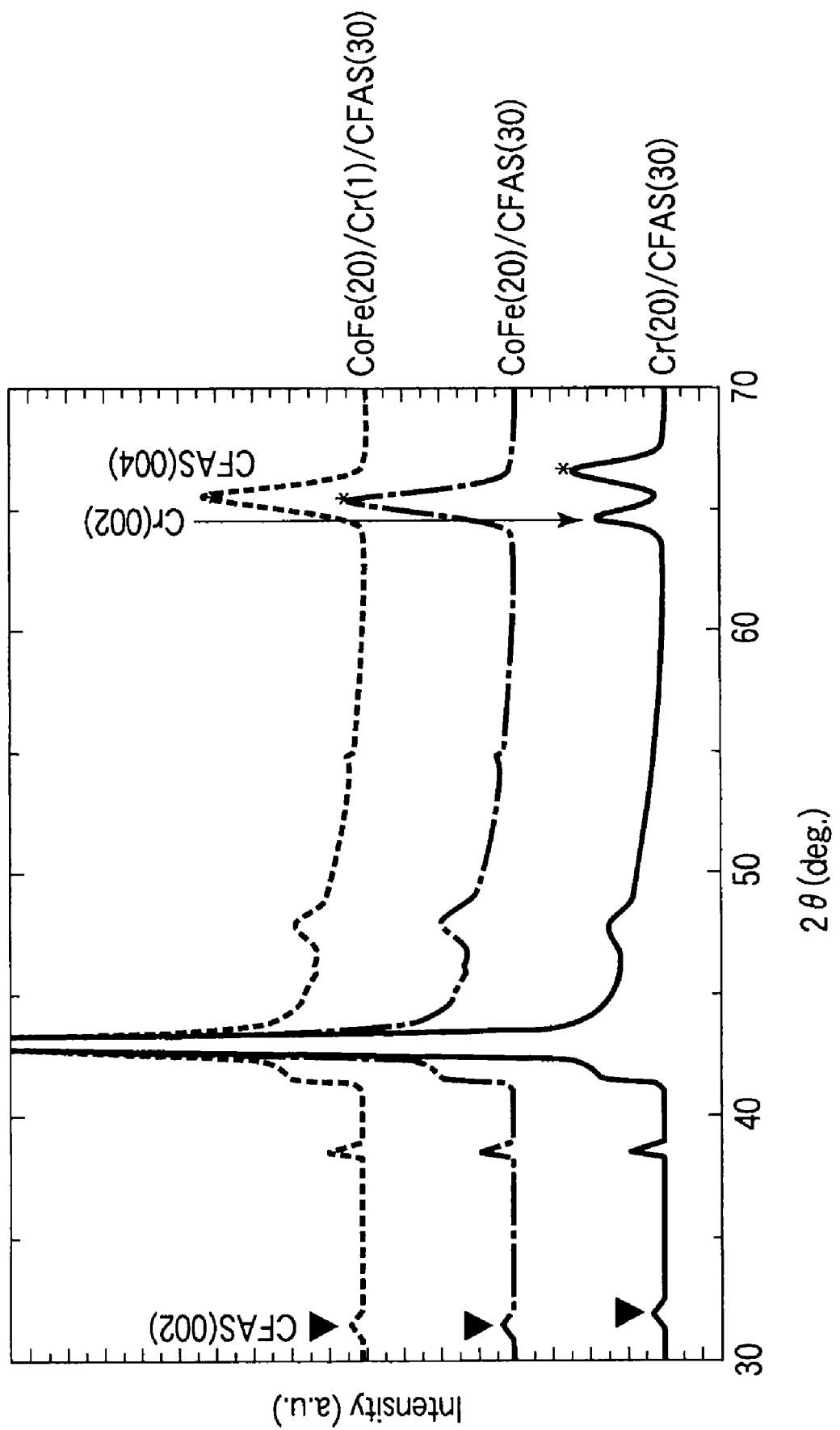
FIG. 11 is a graph showing the results of X-ray diffraction (XRD) evaluation of the comparative example and example.

FIG. 11 shows the results of evaluation performed the crystal structures of the formed Heusler alloys by an X-ray diffraction apparatus. FIG. 11 reveals that the formed Heusler alloy had the B2 structure because a (002) peak was observed. FIG. 11 also indicates that even when the 1-nm-thick Cr film 13 was formed in the interface between the CoFe layer 43 having the bcc structure and the Heusler alloy layer 14 made of $Co_2FeAl_{0.5}Si_{0.5}$, the Heusler alloy layer 14 maintained the B2 structure, and the lattice constant remained unchanged. This shows that when a thin Cr layer is formed in the interface between a ferromagnetic layer having the bcc structure and a Heusler alloy layer, it is possible to form a Heusler alloy that takes over the lattice constant of the ferromagnetic layer having the bcc structure. Note that CFAS in FIG. 11 represents the Heusler alloy made of $Co_2FeAl_{0.5}Si_{0.5}$. Note also that an expression such as CFAS(30)/Cr(1)/CoFe(20) represents a structure in which a Cr layer (film thickness=1 nm) and a Heusler alloy (film thickness=30 nm) made of $Co_2FeAl_{0.5}Si_{0.5}$ are sequentially formed on a CoFe layer (film thickness=20 nm).

Also, a Cr layer having the bcc structure and a CoFe layer having the bcc structure were formed instead of the CoFe layer 43 having the bcc structure in the structure shown in FIG. 10. More specifically, a Cr layer having the bcc structure was formed on an MgO substrate 11, and a CoFe layer having the bcc structure was formed on this Cr layer. A Cr layer 13 was formed on the CoFe layer. The TMR ratio of a tunneling magnetoresistive effect element having this structure further increased. Accordingly, the above-mentioned elements of a ferromagnetic layer having the bcc structure may also be partially substituted with other elements as long as the bcc structure is maintained. Even in this case, the crystallinity of the Heusler alloy on the ferromagnetic layer improves, and as a consequence the magnetic characteristics and the like of the alloy also improve. The above ferromagnetic layer may also have a stacked structure.

From the foregoing, the example of the present invention makes it possible to form a Heusler alloy having a highly regular crystal structure, and realize a tunneling magnetoresistive effect element having a high TMR ratio. When the structure shown in FIG. 10 of this example is formed on a semiconductor substrate, carriers to which the degree of freedom of spins is added can be conducted from the ferromagnetic layer having the bcc structure into the semiconductor substrate.

The embodiments of the present invention can provide a tunneling magnetoresistive effect element that uses a Heusler alloy having a highly regular crystal structure and has a high TMR ratio, and a spin MOS field-effect transistor using this tunneling magnetoresistive effect element.

Also, the above-mentioned embodiments can be practiced not only singly but also in the form of an appropriate combination. Furthermore, the aforesaid embodiments include inventions in various stages, so inventions in various stages can also be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin MOS field-effect transistor comprising, in at least one of a source and a drain, a structure including:
   an MgO layer formed on a semiconductor substrate;
   a first ferromagnetic layer formed on the MgO layer and having a body-centered cubic lattice structure;
   a Cr layer formed on the first ferromagnetic layer and having the body-centered cubic lattice structure, the Cr layer having a film thickness of 3 nm or less;
   a Heusler alloy layer formed on the Cr layer and having one of a B2 structure and an $L2_1$ structure;
   a barrier layer formed on the Heusler alloy layer; and
   a second ferromagnetic layer formed on the barrier layer.

2. The transistor according to claim 1, wherein the second ferromagnetic layer contains a Heusler alloy.

3. The transistor according to claim 1, wherein the first ferromagnetic layer contains a material selected from the group consisting of iron (Fe), iron cobalt (Fe—Co), iron manganese (Fe—Mn), alloys containing at least one of vanadium (V), niobium (Nb), molybdenum (Mo), tantalum (Ta), nickel (Ni), and tungsten (W) in addition to Fe, Fe—Co, and Fe—Mn, and stacked structures of the materials described above.

4. The transistor according to claim 1, wherein the semiconductor substrate is made of a material selected from the group consisting of Si, Ge, GaAs, and Si—Ge.

* * * * *

UNITED STATES PATENT AND TRADEMARK OFFICE
CERTIFICATE OF CORRECTION

PATENT NO. : 8,335,059 B2
APPLICATION NO. : 13/533198
DATED : December 18, 2012
INVENTOR(S) : Mizue Ishikawa et al.

Page 1 of 1

It is certified that error appears in the above-identified patent and that said Letters Patent is hereby corrected as shown below:

Title page, Item 54 should read --TUNNELING MAGNETORESISTIVE EFFECT ELEMENT AND SPIN MOS FIELD-EFFECT TRANSISTOR--.

Signed and Sealed this
Twelfth Day of February, 2013

Teresa Stanek Rea
*Acting Director of the United States Patent and Trademark Office*

UNITED STATES PATENT AND TRADEMARK OFFICE
CERTIFICATE OF CORRECTION

| | |
|---|---|
| PATENT NO. | : 8,335,059 B2 |
| APPLICATION NO. | : 13/533198 |
| DATED | : December 18, 2012 |
| INVENTOR(S) | : Mizue Ishikawa et al. |

It is certified that error appears in the above-identified patent and that said Letters Patent is hereby corrected as shown below:

Title page, Item 54 and at Column 1, lines 1 and 2, Title should read --TUNNELING MAGNETORESISTIVE EFFECT ELEMENT AND SPIN MOS FIELD-EFFECT TRANSISTOR--.

This certificate supersedes the Certificate of Correction issued February 12, 2013.

Signed and Sealed this
Nineteenth Day of March, 2013

Teresa Stanek Rea
*Acting Director of the United States Patent and Trademark Office*